United States Patent
Morris et al.

(10) Patent No.: US 8,495,435 B2
(45) Date of Patent: Jul. 23, 2013

(54) DYNAMIC PHYSICAL MEMORY REPLACEMENT THROUGH ADDRESS SWAPPING

(75) Inventors: Tonia G. Morris, Irmo, SC (US);
Lawrence D. Blankenbeckler, Lexington, SC (US)

(73) Assignee: Intel Corporation, Santa Clara, CA (US)

( * ) Notice: Subject to any disclaimer, the term of this patent is extended or adjusted under 35 U.S.C. 154(b) by 281 days.

(21) Appl. No.: 12/887,966

(22) Filed: Sep. 22, 2010

(65) Prior Publication Data
US 2012/0072768 A1 Mar. 22, 2012

(51) Int. Cl.
*G11C 29/00* (2006.01)
(52) U.S. Cl.
USPC ............... 714/710; 714/6.2; 714/711; 711/3; 365/200; 365/230.08
(58) Field of Classification Search
USPC ............... 714/6.2, 710–711; 711/3; 365/200, 365/230.08
See application file for complete search history.

(56) References Cited

U.S. PATENT DOCUMENTS

| | | | |
|---|---|---|---|
| 2003/0163756 A1 | 8/2003 | George | |
| 2004/0170057 A1 | 9/2004 | Khouri et al. | |
| 2006/0250909 A1 * | 11/2006 | Chen et al. | ............... 369/47.11 |
| 2007/0081401 A1 | 4/2007 | Chen | |
| 2009/0147599 A1 * | 6/2009 | Lakhani et al. | ............... 365/200 |
| 2009/0287957 A1 | 11/2009 | Bilger et al. | |

OTHER PUBLICATIONS

International Search Report and Written Opinion mailed May 1, 2012 for PCT Application No. PCT/US2011/051896, 9 pages.

* cited by examiner

*Primary Examiner* — Guy Lamarre
(74) *Attorney, Agent, or Firm* — Schwabe, Williamson & Wyatt, P.C.

(57) ABSTRACT

An apparatus, system, method, and machine-readable medium are disclosed. In one embodiment the apparatus includes an address swap cache. The apparatus also includes memory segment swap logic that is capable of detecting a reproducible fault at a first address targeting a memory segment. Once detected, the logic remaps the first address targeting the faulty memory segment with a second address targeting another memory segment. The logic stores the two addresses in an entry in the address swap cache. Then the memory segment swap logic receives a memory transaction that is targeting the first physical address and use the address to perform a lookup process in the address swap cache to determine if an entry exists that has the faulty address. If an entry does exist for that address, the logic then swaps the second address into the memory transaction for the first address.

20 Claims, 7 Drawing Sheets

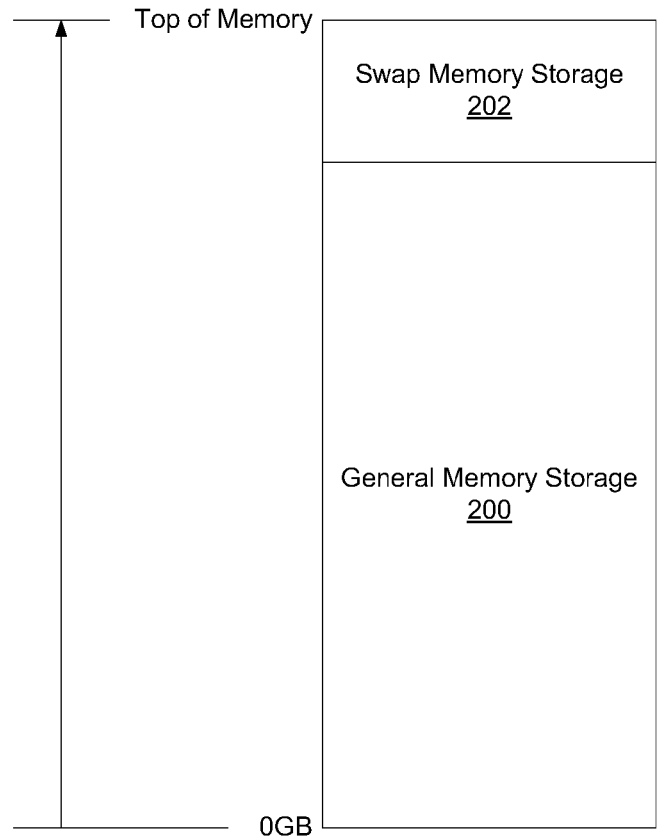

FIG. 2A

| Error Page Rank, Bank, Row Address, Column Address | Count |
|---|---|
| Error Page Rank, Bank, Row Address, Column Address | Count |
| Error Page Rank, Bank, Row Address, Column Address | Count |
| Error Page Rank, Bank, Row Address, Column Address | Count |
| Error Page Rank, Bank, Row Address, Column Address | Count |
| Error Page Rank, Bank, Row Address, Column Address | Count |
| Error Page Rank, Bank, Row Address, Column Address | Count |
| Error Page Rank, Bank, Row Address, Column Address | Count |

FIG. 2B

| Swap Range Addr Offset | Bad Page Rank, Bank, Row Address, Column Address | Valid Bit |
|---|---|---|
| Swap Range Addr Offset | Bad Page Rank, Bank, Row Address, Column Address | Valid Bit |
| Swap Range Addr Offset | Bad Page Rank, Bank, Row Address, Column Address | Valid Bit |
| Swap Range Addr Offset | Bad Page Rank, Bank, Row Address, Column Address | Valid Bit |
| Swap Range Addr Offset | Bad Page Rank, Bank, Row Address, Column Address | Valid Bit |
| Swap Range Addr Offset | Bad Page Rank, Bank, Row Address, Column Address | Valid Bit |
| Swap Range Addr Offset | Bad Page Rank, Bank, Row Address, Column Address | Valid Bit |
| Swap Range Addr Offset | Bad Page Rank, Bank, Row Address, Column Address | Valid Bit |

FIG. 3

DYNAMIC PHYSICAL MEMORY REPLACEMENT THROUGH ADDRESS SWAPPING

FIELD OF THE INVENTION

The invention relates to replacing bad portions of system memory out with spare good portions of system memory through address swaps.

BACKGROUND OF THE INVENTION

When portions of a dynamic random access memory (DRAM) device in a dual in-line memory module (DIMM) fail, the entire DRAM device is generally considered a bad DRAM or in a worst case scenario the DIMM is considered a bad DIMM. Considering entire DRAM devices or entire DIMMs bad because a portion of a DRAM device has failed reduces the yield of working DRAMs/DIMMs for memory manufacturers, increases their cost, and lengthens the manufacturing time for Original Equipment Manufacturers (OEMs) since replacement DIMMs must be handled and retested prior to shipping the product. Additionally, portions of a DRAM device may also fail during the lifetime of the device, even when the device comes off the manufacturing line in perfect working condition. This is due to normal wear and tear that takes place over a lifetime of usage of the device. These failures generally happen once the DRAM/DIMM is in the use of an end user/customer and will cause the person to replace the entire DIMM when a majority of the memory in the DIMM may still be working properly.

BRIEF DESCRIPTION OF THE DRAWINGS

The present invention is illustrated by way of example and is not limited by the drawings, in which like references indicate similar elements, and in which:

FIG. 2A illustrates the physical address space of all system memory including the portion to store replacement memory segments.

FIG. 2B illustrates an embodiment of the bad segment detection cache.

FIG. 3 illustrates an embodiment of the address swap cache.

DETAILED DESCRIPTION OF THE INVENTION

Elements of an apparatus, system, method, and machine-readable medium to implement swapping of physical memory segments are disclosed.

There are references throughout this document to the term memory "segment." A segment of memory is meant to convey a generic portion of memory. In different embodiments, a segment could mean a portion of memory as small as one stored bit of information or it could mean a portion of memory that takes up more than an entire device of memory. Though, generally, a segment of memory may convey a cacheline of memory or a physical page of memory in many embodiments. Cachelines vary in size based upon the specific implementation per processor but generally range from 8 to 1024 bytes in current solutions. A physical memory page also may vary in size. For example, a common size memory page may be 4 Kilobytes.

A memory segment in a memory device may fail for a number of reasons including imperfections in the manufacturing process to normal wear and tear of the device. Many memory devices that have failed segments are mostly still operational other than the failed segments. Frequently, entire memory modules are discarded because a few segments within one or more devices on the module fail.

An apparatus, system, method, and machine-readable medium are proposed to track failed memory segments, swap them with good memory segments that are not in use, and continue to utilize the memory device/module in which the memory segment is located by dynamically swapping addresses in memory transactions of failed segments with addresses of good segments.

Figure 1:
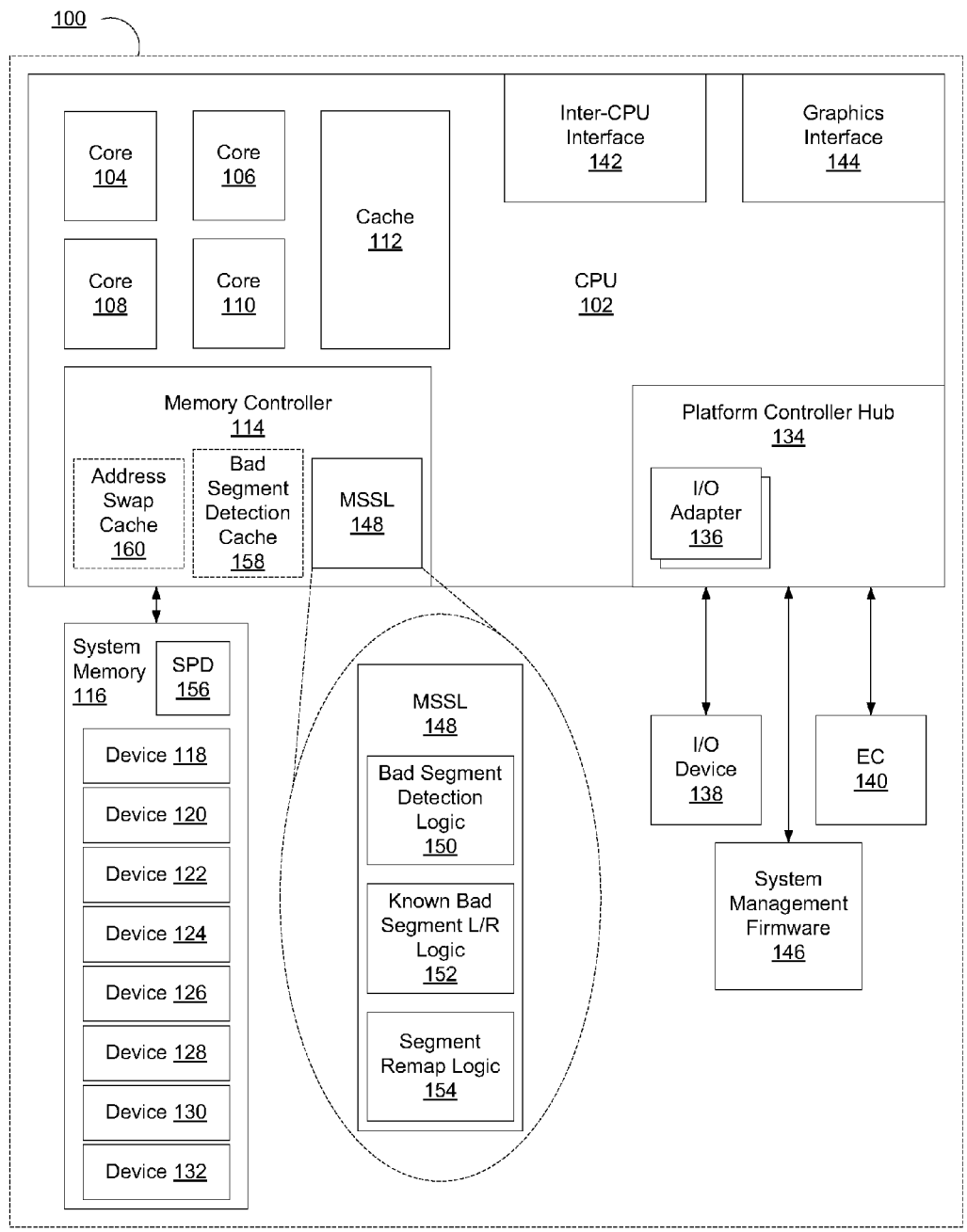
FIG. 1 illustrates an embodiment of a computer system capable of dynamically replacing memory segments using address swapping.

FIG. 1 illustrates an embodiment of a computer system capable of dynamically replacing memory segments using address swapping.

Computer system 100 is shown. The computer system may be a desktop, server, workstation, laptop, handheld, television set-top, media center, game console, integrated system (such as in a car), or other type of computer system. In several embodiments the computer system 100 includes one or more central processing units (CPUs), also referred to as "processors." Although in many embodiments there are potentially many CPUs, in the embodiment shown in FIG. 1 only CPU 102 is shown for clarity. CPU 102 may be an Intel® Corporation CPU or a CPU of another brand. CPU 102 includes one or more cores in different embodiments. CPU 102 is shown including four cores (Cores 104, 106, 108, and 110).

In many embodiments, each core includes internal functional blocks such as one or more execution units, retirement units, a set of general purpose and specific registers, etc. In a single-threaded core, each core may be referred to as a hardware thread. When a core is multi-threaded or hyper-threaded, then each thread operating within each core may also be referred to as a hardware thread. Thus, any single thread of execution running in the computer system 100 may be referred to as a hardware thread. For example, in FIG. 1, if each core is single-threaded, then there are four hardware threads present in the system (four cores). On the other hand, if each core is multi-threaded and has the capability of maintaining the states of two threads simultaneously, then there are eight hardware threads present in the system (four cores with two threads per core).

CPU 102 may also include one or more caches, such as cache 112. In many embodiments that are not shown, additional caches other than cache 112 are implemented so that multiple levels of cache exist between the execution units in each core and memory. In different embodiments cache 112 may be apportioned in different ways. Additionally, cache 112 may be one of many different sizes in different embodiments. For example, cache 112 may be an 8 megabyte (MB) cache, a 16 MB cache, etc. Additionally, in different embodiments the cache may be a direct mapped cache, a fully associative cache, a multi-way set-associative cache, or a cache with another type of mapping. In many embodiments, cache 112 may include one large portion shared among all cores or may be divided into several separately functional slices (e.g., one slice for each core). Cache 112 may also include one portion shared among all cores and several other portions that are separate functional slices per core.

In many embodiments, CPU 102 includes an integrated system memory controller 114 to provide an interface to communicate with system memory 116. In other embodiments that are not shown, memory controller 114 may be located in a discrete component, separate from CPU 102, elsewhere in computer system 100.

System memory 116 may comprise several dynamic random access memory (DRAM) devices, such as a type of double data rate (DDR) DRAM. For example, devices 118-132 may be present in system memory on a dual inline memory module (DIMM) or other similar memory module. FIG. 1 shows a single memory module with eight devices, though in other embodiments there may be more than one memory module in system memory and there may be more or less than eight devices on each memory module.

System memory 116 may be a general purpose memory to store data and instructions to be operated upon by CPU 102. Additionally, there may be other potential devices within computer system 100 that have the capability to read and write to the system memories, such as a direct memory access (DMA)-capable I/O (input/output) device.

The link (i.e., bus, interconnect, etc.) that couples CPU 102 with system memory 116 may include one or more optical, metal, or other wires (i.e. lines) that are capable of transporting data, address, control, and clock information.

Platform controller hub (PCH) 134 (e.g., a complex of I/O controller and other circuitry) includes an I/O interface that enables communication between the CPU 102 and external I/O devices. The hub may include one or more I/O adapters, such as I/O adapter 136. I/O adapters translate a host communication protocol utilized within the CPU 102 to a protocol compatible with a particular I/O device, such as I/O device 138. Some of the protocols that a given I/O adapter may translate include a Peripheral Component Interconnect (PCI)-Express protocol, Universal Serial Bus (USB), Serial Advanced Technology Attachment (SATA) interface, Ethernet, and 1394 "Firewire," among others. Additionally, there may be one or more wireless protocol I/O adapters. Examples of wireless protocols are Bluetooth, IEEE 802.11-based wireless protocols, and cellular protocols, among others.

Apart from I/O devices, the PCH 134 also may be coupled to one or more embedded controllers (ECs) in the system, such as EC 140. EC 140 may incorporate a number of functions. For example, a RAID storage controller device may be present within computer system 100. The RAID controller may manage an array of hard disk drives or solid state disks (SSDs). Other examples of the controller device may be a discrete out-of-band manageability engine, a keyboard controller, or another type of controller.

In other embodiments, PCH 134 is a discrete device located externally to the CPU 102. In these embodiments, an interface such as a direct memory interface (DMI) couples the CPU to the PCH. Though, these embodiments are not shown.

Inter-CPU interface 142 may provide an interface to a link coupled to one or more additional CPUs and allow inter-CPU communications to take place. E.g., Inter-CPU high-speed interface may be a Quick Path Interconnect (QPI) or other similar interface. Although additional CPUs are not shown in FIG. 1, in many embodiments CPU 102 is one of multiple CPUs present within computer system 100. In many embodiments, Inter-CPU interface 142 provides a point-to-point high-speed communication interface between CPU 102 and each of the other CPUs present in the system.

Graphics interface 144 may provide an interface to a link coupled to a discrete graphics controller (a discrete graphics controller is not shown). The interface may be a high-speed platform component interconnect (PCI)-Express interface or another high-speed interface. In other embodiments, CPU 102 includes an integrated graphics controller and graphics interface 144 may be coupled to a display device, such as a monitor. In many embodiments, the interface is high-speed to allow for significant graphical data traffic to be transferred across the link (e.g., 3D graphics, video, etc.).

The computer system 100 also includes a system management firmware 146 to provide boot instructions to initialize the computer system and components. In different embodiments, system management firmware may be a basic input/output system (BIOS), an extendible firmware, or another form of firmware instructions the computer system may utilize during the boot of the platform.

The computer system 100 includes memory segment swap logic (MSSL) 148. In many embodiments, such as the one shown in FIG. 1, the MSSL 148 is located within memory controller 114. Though, in other embodiments that are not shown, MSSL 148 is located elsewhere in the computer system. MSSL 148 includes logic to allow for swapping bad memory segments out for spare good segments. When a segment of memory on a DIMM fails, the MSSL 148 has the capability of detecting the failure and swapping the failed segment out for a good segment that is unused. A memory segment may be deemed to have failed based on a reproducible error in any transaction to the same address. The error does not have to be the same error, but if the memory segment is unstable, then bad data will result often and that would result in a general reproducible error when checking memory transactions to the same memory segment.

The portion of memory that fails may be smaller or larger than the size of a given segment, however the segment is defined. For example, if a memory segment is defined as a cacheline and the cacheline is 512 bytes, but only 4 bytes of the cache line fail, the swap would replace the entire cacheline. On the other hand, if the memory fails across multiple cachelines, then the swap would replace the set of cachelines covering the failed memory locations. In many embodiments, each cacheline failure would require a separate swap transaction since the swapping would be done on a segment by segment basis.

The previously unused good segment that is swapped in to replace the failed segment may be stored in a portion of physical system memory 116 designated to store replacement memory segments for use during a swap.

FIG. 2A illustrates the physical address space of all system memory including the portion to store replacement memory segments.

Physical system memory address space starts at 0 GB (gigabyte) address and progresses linearly up to the top of memory. All of physical system memory address space is represented within this address range. In many embodiments, the physical address space is separated into two portions, a general memory storage 200 and a swap memory storage 202. The designation of memory address ranges for these two portions of system memory may be done during the boot of the system (e.g., the system management firmware 146 may include code to separate memory into these two address ranges).

The general memory storage 200 range will generally be a larger range than the swap memory storage 202 because general memory storage 200 includes the memory space utilized from each boot and during normal operation of the computer system while the swap memory storage 202 includes only those memory locations that target memory segments used for replacing bad memory segments during memory segment swaps. Thus, if all memory locations are working properly, the swap memory storage 202 is not utilized. The segments within the swap storage are not utilized until the MSSL 148 determines that one or more segments have failed.

The specific location of the memory swap storage 202 within the entire range of address space is implementation specific. The memory swap storage 202 in FIG. 2A is located at the top of physical memory address space. In other embodiments that are not shown the memory swap storage 202 may be near the bottom of physical memory address space or potentially in a relatively centralized location between the bottom and top of memory.

Returning to FIG. 1, when memory requests arrive at the memory controller 114, the MSSL 148 performs a lookup to determine if the attempted memory access is targeting a bad segment and if so, remaps the request to the good segment that replaced the bad segment. Further details regarding the detection, lookup, and remapping processes will be discussed below. To assist with these performed processes, the MSSL 148 includes several components, which are shown in the blown up window of MSSL 148 (in the dashed line oval) in FIG. 1. Specifically, MSSL 148 includes bad segment detection logic 150, known bad segment lookup and replacement (L/R) logic 152, and segment remap logic 154.

The bad segment detection logic may be implemented in several ways. For example, in some embodiments, this swap process extends to memory segments that have failed during manufacturing. Thus, when a DIMM comes off the manufacturing line there may be a certain number of segments that are known to have failed from the first time the DIMM is tested prior to being sold. The manufacturer may chart the memory segments that have failed in the device and program those into a non-volatile memory storage on the DIMM. The memory controller 114 may read a Serial Presence Detect (SPD) non-volatile memory 156 on the DIMM during system boot. The SPD memory 156 may include addresses of the known bad memory segments on the DIMM. Boot software, the segment remap logic 154, or other logic present in the computer system may then utilize this bad segment information retrieved from the SPD 156 to program the appropriate entries into the address swap cache 160.

Another detection embodiment may be a dynamic detection during system operation. In many embodiments, the bad segment detection logic keeps track of the segments of memory that return bad data during memory transactions. For example, a memory request to an address in memory may arrive at the memory controller 114. The request is then sent to system memory 116 and the memory may return ECC (error checking and correction) information. The ECC information may inform the memory controller 114 as to whether there was an error with the transaction at the memory segment at the target address. If an error has occurred, bad segment detection logic 150 within the MSSL 148 may keep track of the transaction and the result. A small storage area within the MSSL 148 or elsewhere within computer system 100 may store the transaction address and the result (i.e., the error). In some embodiments, bad segment detection cache 158 will store this information. The information may be limited to the target address of the memory transaction and a count of errors originating from the address. For example, if the address is targeted eight times in eight different transactions and three of those transactions result in ECC errors, the count at the address location would be 3.

In other embodiments, there may be a specific time during the boot process of the computer system wherein DIMMs are tested. Additionally, system management firmware 146 may also restore information from previous DIMM tests regarding known bad memory segments. This information may be restored into the address swap cache 160 at each boot of the computer system 100.

FIG. 2B illustrates an embodiment of the bad segment detection cache.

The bad segment detection logic will populate each location in the cache with a memory segment address location (e.g., page rank, bank, row, column) once the segment at that address returns an error. Returning to FIG. 1, for each error, bad segment detection logic 150 will perform a lookup in the bad segment detection cache to determine if the address is already in the cache. If the address is not already in the bad segment detection cache, it is then added at a new cache entry location, and the count value is initialized at 1. If the address is already in the bad segment detection cache, then the count value at that entry is incremented.

In many embodiments, a threshold value will be utilized by the bad segment detection logic 150 to determine when a memory segment is designated as having failed. For example, the threshold value might require one hundred transaction failures to the address in question. Another example might lead to a ratio value, if a ratio of a total number of errors resulting from a transaction targeting the address in question is divided by a total transaction count to the address in question is too high, then bad segment detection logic 150 may determine that the memory segment at the target address has failed. In any case, once bad segment detection logic has determined a memory segment has failed, the segment remap logic 154 is given the target address of the newly failed segment.

The segment remap logic then adds the target address as an entry in an address swap cache 160, which stores the addresses of all failed memory segments.

FIG. 3 illustrates an embodiment of the address swap cache.

Each entry in the address swap cache first includes a swap range address offset value that is an index into the address swap cache. The segment remap logic (154 in FIG. 1) may internally store a base address value of the start of the swap memory storage (i.e., 202 in FIG. 2A) as well as a range value of the swap memory storage, which will give the size of the address swap cache when combined with the base address value. The base address and range values may be stored in internal registers within the memory controller or elsewhere in the computer system.

The address swap cache also includes the address of the failed (i.e., bad) memory segment (e.g., page, rank, bank, row, column). The remaining column within the address swap cache includes storage for a valid bit. The valid bit signifies whether a particular entry in the address swap cache is in use (i.e., valid) or free for future use (i.e., invalid).

Returning to FIG. 1, once the segment remap logic 154 stores the entry, the MSSL 148 is then capable of performing a swap during system operation for that failed memory segment. For example, at some later point in time, a memory request arrives at the memory controller 114 at memory address X. The known bad segment L/R logic 152 within the MSSL 148 then accesses the address swap cache 160 and performs a lookup at memory address X. If there is no entry within the address swap cache 160 at memory address X, then the known bad segment L/R logic 152 allows the memory request to continue on to the system memory to complete the transaction. On the other hand, if there is an entry at memory address X, then the address of the memory segment at the [swap memory storage base address value]+[swap address range offset value] of the entry is utilized instead.

The known bad segment L/R logic 152 then replaces the old memory transaction target address with the new swapped address, this allows the memory transaction to complete using the swapped memory segment instead of the originally targeted memory segment.

Figure 4:
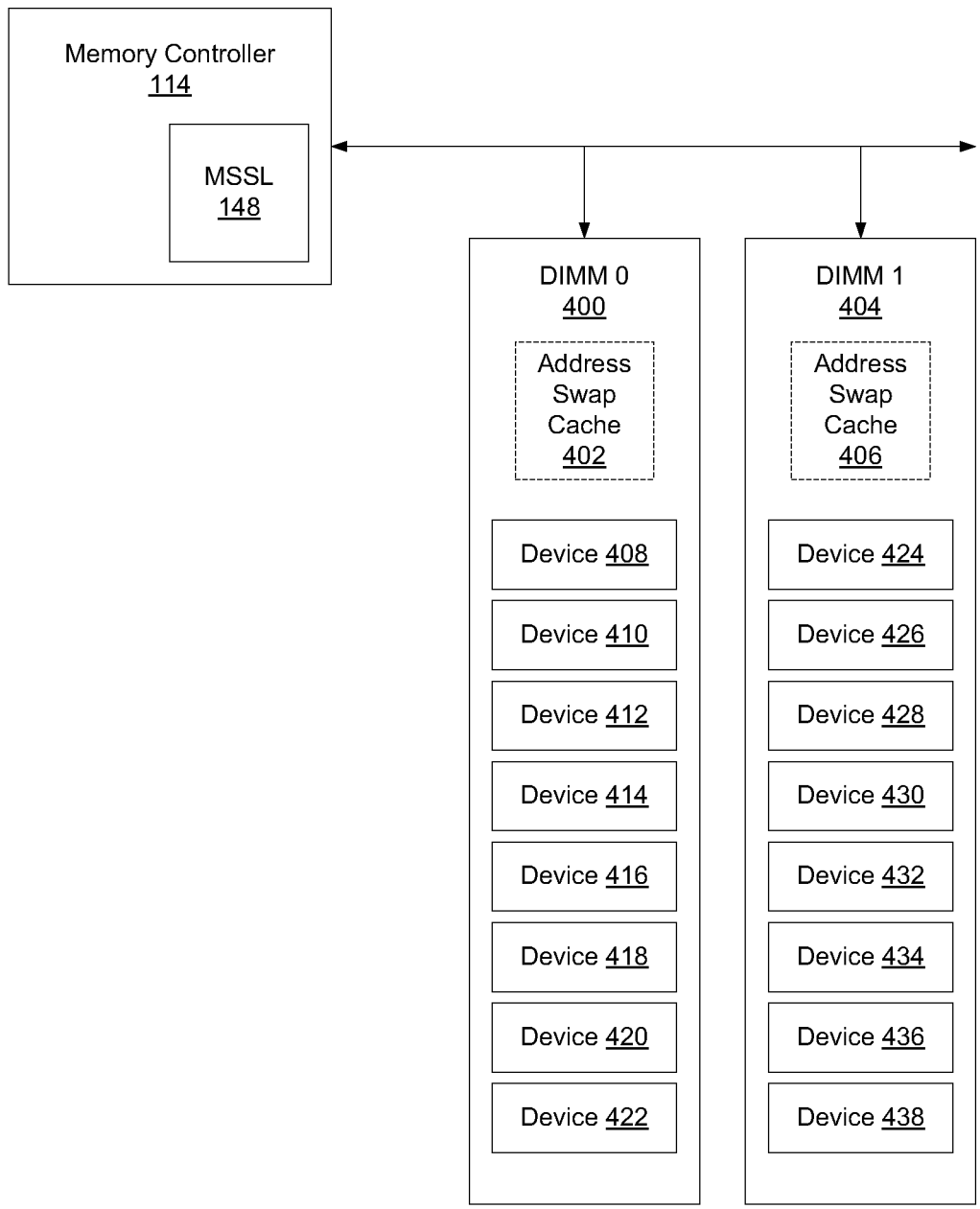
FIG. 4 illustrates an embodiment of an alternative memory subsystem configuration utilizing memory segment swap logic.

FIG. 4 illustrates an embodiment of an alternative memory subsystem configuration utilizing memory segment swap logic.

The memory controller 114 is similar to the memory controller in FIG. 1 except the address swap cache that was previously integrated into the memory controller is now placed on each DIMM in the system. For example, in the specific embodiment in FIG. 4 there are two DIMMs, DIMM 0 (400) that includes address swap cache 402 and DIMM 1 (404) that includes address swap cache 406. The swap caches are specific for each DIMM, thus address swap cache 402 includes entries for failed memory segments that are physically located within one or more of devices 408-422 and address swap cache 406 includes entries for failed memory segments that are physically located within one or more of devices 424-438. Though not shown, in some embodiments, the entire MSSL (148 in FIG. 1) may be integrated into each DIMM or potentially into each memory device.

Figure 5:
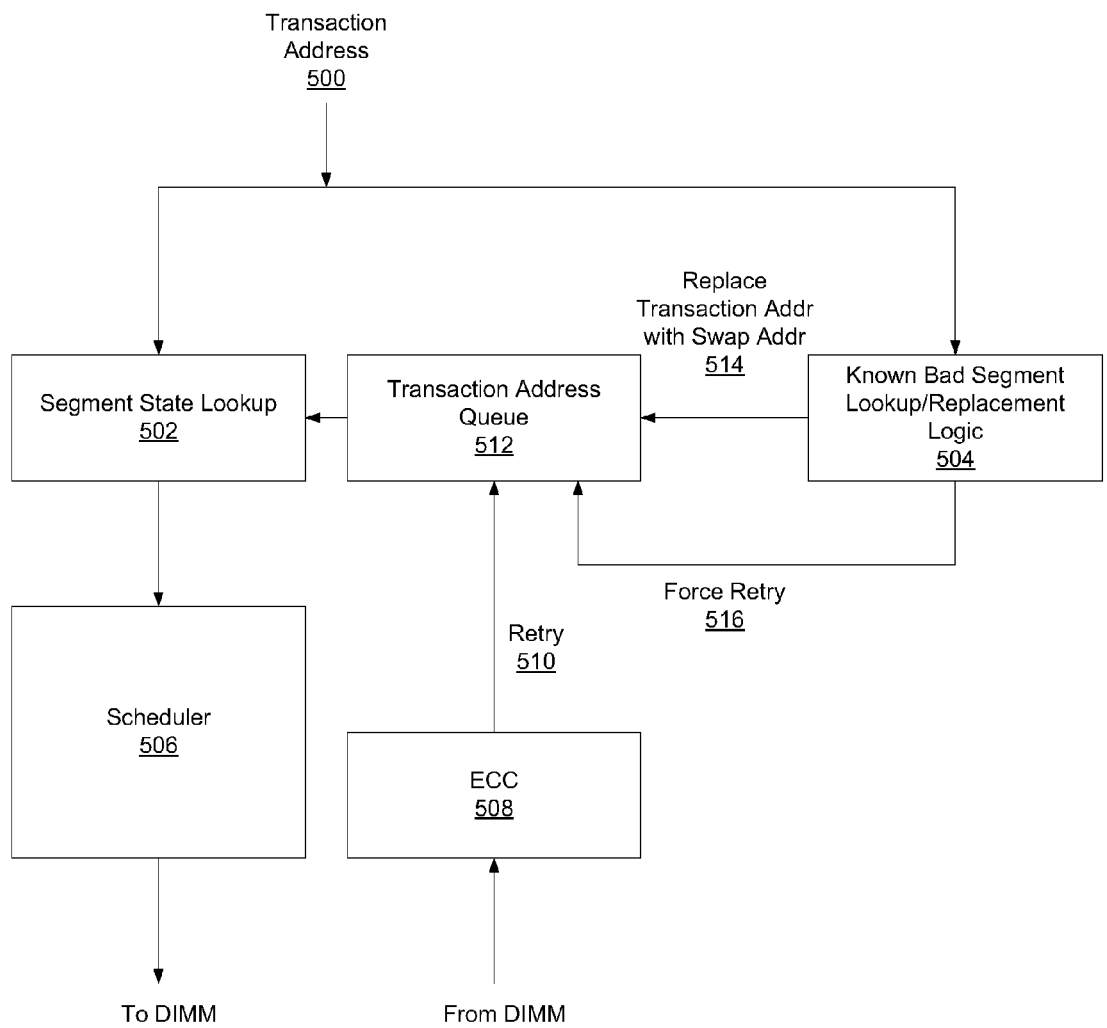
FIG. 5 illustrates an embodiment of the detailed logic that is within a memory controller which is utilized when performing a memory segment lookup and swap in a parallel manner to the basic memory transaction.

FIG. 5 illustrates an embodiment of the detailed logic that is within a memory controller which is utilized when performing a memory segment lookup and swap in a parallel manner to the basic memory transaction.

At the beginning of a process that may include a swap, a memory request/transaction enters the memory controller. The memory request has a transaction address 500 of the target memory segment. The transaction address simultaneously may be sent to a memory segment state lookup logic component 502 as well as a known bad segment L/R logic component 504. The segment state lookup logic 502 performs a standard state lookup of the memory segment, which may include performing a segment table lookup at the address to determine a number of state indicators regarding the segment (e.g., whether the segment is privileged/protected/read-only/open/closed/etc.). Once the segment state lookup has been performed, the transaction address 500 is sent to the scheduler 506 (if the address is still accessible after the state of the segment has been determined). The scheduler 506 sends transaction to the targeted DIMM.

The DIMM returns the result of the transaction to the memory controller, which may involve sending the data to ECC logic 508. The ECC logic 508 determines whether there is an error in the data that was retrieved and, if so, sends a retry request including the transaction address to the transaction address queue 512. The segment state lookup logic 502 then takes the transaction out of the transaction address queue and retries the transaction. That portion of the logic and process comprises a standard memory transaction. In the embodiment shown, an ECC check is shown to be included, though in other embodiments that are not shown, the system may detect memory segment errors in some other manner, in these embodiments there may not be an ECC check involved in the process.

Beyond the standard memory transaction logic, the transaction address 500, which arrives with the memory request, is also sent to the bad segment L/R logic 504. During the standard memory request transaction process, the bad segment L/R logic 504 simultaneously performs a lookup of the transaction address 500. The bad segment L/R logic 504 will search the address swap cache (160 in FIG. 1) to determine if the transaction address 500 is a known failed address. If not, there is nothing else for the bad segment L/R logic 504 to do. On the other hand, if the transaction address 500 is targeting a known failed memory segment (because there was a hit on the address swap cache search), then the known bad segment L/R logic 504 replaces the transaction address with the swap address 514 (received from the address swap cache entry), sends the swap address to the transaction address queue 512, and sends a forced retry command 516 to the transaction address queue 512 to attempt the retry of the memory transaction using the new swap address.

Generally, if the original transaction address needs to be swapped, the transaction address queue 512 can invalidate the memory transaction and require a retry, thus the memory controller becomes aware of the retry and invalidates the transaction with the original transaction address 500.

The embodiment shown in FIG. 5 eliminates the overhead of the bad segment lookup process because that is performed in parallel to the standard memory transaction process. If the bad segment address lookup returns a miss, there is no lost latency related to the bad segment address lookup. If the bad segment address lookup returns a hit, then the memory transaction currently in the pipeline to be scheduled to memory is invalidated and the transaction is then retried utilizing the new address.

Figure 6:
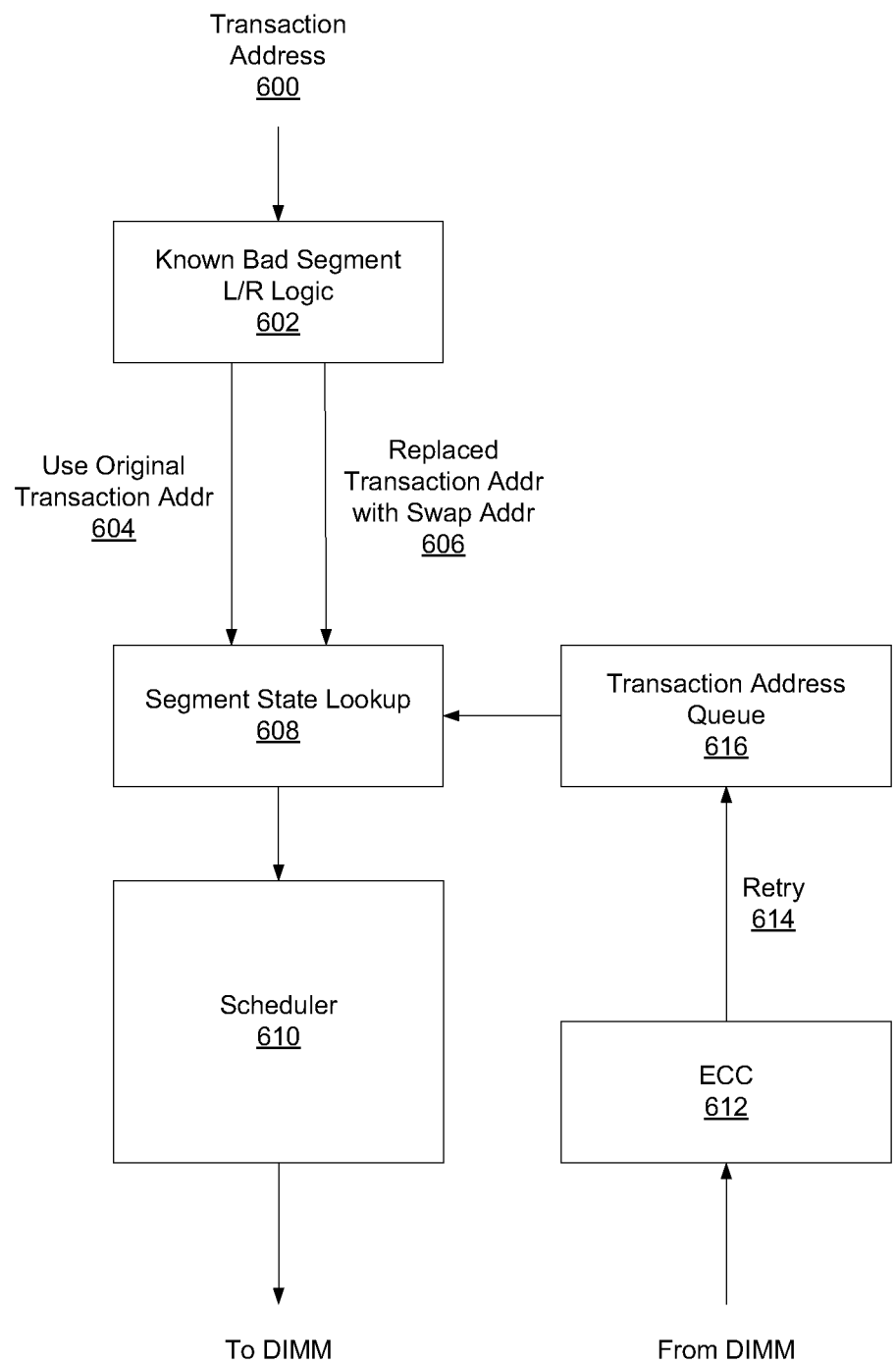
FIG. 6 illustrates an embodiment of the detailed logic that is within a memory controller which is utilized when performing a memory segment swap in a serial manner prior to the basic memory transaction.

FIG. 6 illustrates an embodiment of the detailed logic that is within a memory controller which is utilized when performing a memory segment swap in a serial manner prior to the basic memory transaction.

At the beginning of a process that may include a swap, a memory request/transaction enters the memory controller. The memory request has a transaction address 600 of the target memory segment.

The transaction address 600 arrives at the known bad segment L/R logic 602. During the standard memory request transaction process, the bad segment L/R logic 602 simultaneously performs a lookup of the transaction address 600. The bad segment L/R logic 602 will search the address swap cache (160 in FIG. 1) to determine if the transaction address 600 is a known failed address. If not, bad segment L/R logic 602 sends the memory transaction as is with the original transaction address 604. On the other hand, if the transaction address 600 is targeting a known failed memory segment (because there was a hit on the address swap cache search), then the known bad segment L/R logic 602 replaces the transaction address with the swap address 606 (received from the address swap cache entry) and sends the memory transaction on to the segment state lookup logic 608 with the replaced transaction address.

The segment state lookup logic 608 performs a standard state lookup of the memory segment, which may include performing a segment table lookup at the address to determine a number of state indicators regarding the segment, just as it was described above in regard to FIG. 5. Once the segment state lookup has been performed, the transaction address, whether that address is the original address or the swapped address, is sent to the scheduler 610. The scheduler 610 sends transaction to the targeted DIMM.

The DIMM returns the result of the transaction to ECC logic 612. The ECC logic 612 determines whether there is an error in the data that was retrieved and, if so, sends a retry request including the transaction address to the transaction address queue 616. The segment state lookup logic 608 then takes the transaction out of the transaction address queue and retries the transaction.

The embodiment shown in FIG. 6 differs from the embodiment in FIG. 5 because the bad segment address lookup is done prior to the segment state lookup portion of the standard memory transaction. This means that the bad segment address lookup latency holds up the completion of any given memory transaction as it is done serially (and prior) to the remaining portion of the memory transaction process.

Figure 7A:
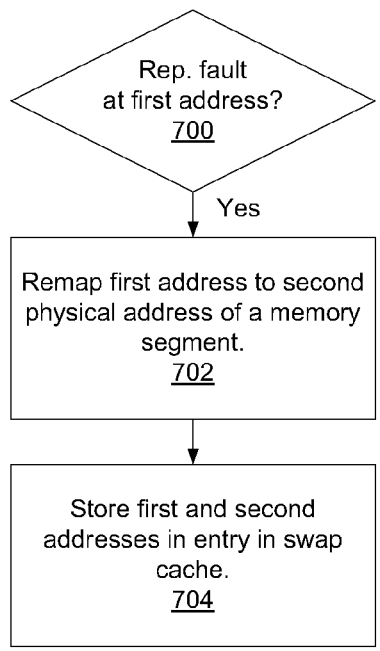
FIG. 7A is a flow diagram of an embodiment of a process to determine a failed memory segment and add the failed memory segment address to a new entry in the address swap cache.

FIG. 7A is a flow diagram of an embodiment of a process to determine a failed memory segment and add the failed memory segment address to a new entry in the address swap cache.

The process is performed by processing logic that may include hardware circuitry, software application, firmware code, or any combination of the above types of processing logic. The process begins by processing logic determining whether a reproducible fault is occurring at a first address targeting a particular memory segment (processing block 700). This determination may be done during testing by the manufacturer, it may be done by an OEM, it may be done during the first initialization of memory during boot, or it may be done dynamically during operation of a computer system that the memory is operating within.

Once the reproducible fault has been determined, then processing logic remaps the first address to a second physical address of a different memory segment (processing block 702). The remapping is completed by processing logic storing the first and second addresses in an entry in the address swap cache (processing block 704). This portion of the process completes the population of the address swap cache with the new failed first address and the replacement second address.

Figure 7B:
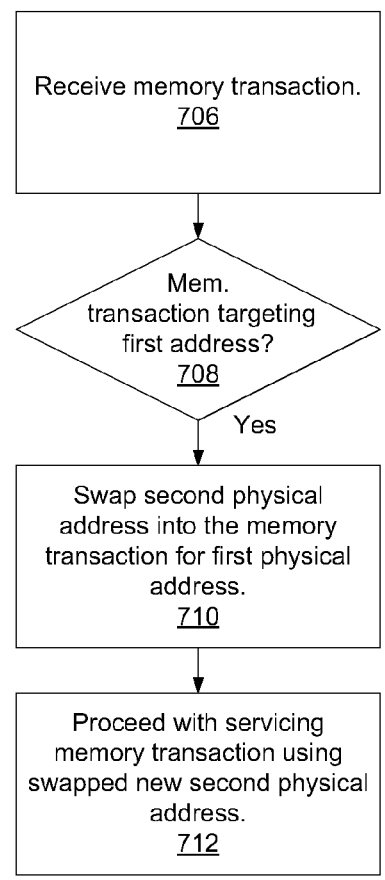
FIG. 7B is a flow diagram of an embodiment of a process to perform an address swap of a replacement memory segment address for an address of a failed memory segment.

FIG. 7B is a flow diagram of an embodiment of a process to perform an address swap of an address of a replacement memory segment for an address of a failed memory segment.

At a later point in time, after the completion of the process illustrated in FIG. 7A, processing logic receives a memory transaction (processing block 706). The memory transaction includes a transaction address pointing to a memory segment. Processing logic retrieves that transaction address and determines whether the address is targeting a failed segment. Specifically in this case with just one failed segment discussed previously in FIG. 7A, the processing logic determines if the first address referred to above is the transaction address (processing block 708). In many embodiments, block 708 scans through an address swap cache to find if the received memory transaction address matches an entry in any location in the cache. In the current embodiment shown, processing logic is looking specifically for the first address in the address swap cache. If there is no match, then the process is complete because there is no prior knowledge that the received memory transaction address has failed (which likely means the address is good and valid).

On the other hand, if the memory transaction address (first address) is present in the address swap cache, then processing logic swaps the second address into the memory transaction and removes the first address (processing block 710). As discussed earlier, the second address is retrieved from the address swap cache at the entry that has the first address. Processing logic then proceeds with servicing the memory transaction using the swapped new second address (processing block 712) and the process is complete.

Elements of embodiments of the present invention may also be provided as a machine-readable medium for storing the machine-executable instructions. The machine-readable medium may include, but is not limited to, flash memory, optical disks, compact disks-read only memory (CD-ROM), digital versatile/video disks (DVD) ROM, random access memory (RAM), erasable programmable read-only memory (EPROM), electrically erasable programmable read-only memory (EEPROM), magnetic or optical cards, propagation media or other type of machine-readable media suitable for storing electronic instructions.

In the description above and in the claims, the terms "include" and "comprise," along with their derivatives, may be used, and are intended to be treated as synonyms for each other. In addition, in the following description and claims, the terms "coupled" and "connected," along with their derivatives may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still cooperate, interact, or communicate with each other.

In the description above, certain terminology is used to describe embodiments of the invention. For example, the term "logic" is representative of hardware, firmware, software (or any combination thereof) to perform one or more functions. For instance, examples of "hardware" include, but are not limited to, an integrated circuit, a finite state machine, or even combinatorial logic. The integrated circuit may take the form of a processor such as a microprocessor, an application specific integrated circuit, a digital signal processor, a microcontroller, or the like.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of embodiments of the invention, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed subject matter requires more features than are expressly recited in each claim. Rather, as the following claims reflect, inventive aspects lie in less than all features of a single foregoing disclosed embodiment. Thus, the claims following the detailed description are hereby expressly incorporated into this detailed description.

The invention claimed is:

1. An apparatus, comprising:
an address swap cache; and
a memory segment swap logic configured to:
   detect a reproducible fault at a first physical address targeting a first physical memory segment in one of a plurality of memory devices;
   in response to the detection of the reproducible fault, remap the first physical address to a second physical address, the second physical address targeting a second physical memory segment in one of the plurality of memory devices;
store the first and second physical addresses in an entry in the address swap cache;
receive a memory transaction targeting the first physical address;
perform a lookup in parallel with a memory controller sending the memory transaction to the one of the plurality of memory devices containing the memory segment targeted by the first physical address, the lookup to identify the entry in the address swap cache storing the first physical address;
in response to the identification, flag the memory transaction invalid and swap the second physical address into the memory transaction for the first physical address, wherein said swap of the first and second physical addresses includes replacement of the first physical address in the memory transaction with the second physical address; and
provide the memory controller with the second physical address for a retry of the memory transaction.

2. The apparatus of claim 1, further comprising a memory swap pool including a plurality of spare memory segments, wherein the second physical address targets a segment of memory in the memory swap pool.

3. The apparatus of claim 2, wherein the memory segment swap logic is further configured to remove the memory segment targeted by the second physical address from the memory swap pool after the remap.

4. The apparatus of claim 2, wherein the plurality of spare memory segments in the memory swap pool are outside of an operating system-visible memory address space.

5. The apparatus of claim 1, wherein the memory segment swap logic is further configured to:
perform the lookup prior to a memory controller sending the memory transaction to the one of the plurality of memory devices containing the memory segment targeted by the first physical address; and
provide the memory controller with the remapped second physical address to send the memory transaction in response to the lookup positively identifying the first physical address as present in the address swap cache.

6. The apparatus of claim 1, further comprising memory error detection logic configured to:
track a number of errors detected for the memory segment targeted by the first physical address over a period of time; and
deem the memory segment targeted by the first physical address to have a reproducible fault in response to the number of errors exceeding a threshold.

7. The apparatus of claim 1, wherein the address swap cache is present on a memory module, the memory module including the plurality of memory devices.

8. The apparatus of claim 1, wherein the address swap cache is integrated into a memory controller.

9. A method, comprising:
detecting a reproducible fault at a first physical address targeting a first physical memory segment in one of a plurality of memory devices;
in response to the detection of the reproducible fault, remapping the first physical address to a second physical address, the second physical address targeting a second physical memory segment in one of the plurality of memory devices;
storing the first and second physical addresses in an entry in an address swap cache;
receiving a memory transaction targeting the first physical address;
performing a lookup in parallel with a memory controller sending the memory transaction to the one of the plurality of memory devices containing the memory segment targeted by the first physical addres, the lookup to identify the entry in the address swap cache storing the first physical address;
in response to the identification, flagging the memory transaction invalid and swapping the second physical address into the memory transaction for the first physical address, the swapping including replacing the first physical address in the memory transaction with the second physical address; and
providing the memory controller with the second physical address for a retry of the memory transaction.

10. The method of claim 9, further comprising:
after the remap, removing the memory segment targeted by the second physical address from a memory swap pool;
wherein the memory swap pool comprises a plurality of spare memory segments, the second physical address targeting a segment of memory in the memory swap pool prior to the removal of the memory segment targeted by the second physical address from the memory swap pool.

11. The method of claim 10, wherein the plurality of spare memory segments in the memory swap pool are outside of an operating system-visible memory address space.

12. The method of claim 9, further comprising:
performing the lookup in parallel with a memory controller sending the memory transaction to the one of the plurality of memory devices containing the memory segment targeted by the first physical address;
flagging the memory transaction invalid in response to the lookup positively identifying the first physical address as present in the address swap cache; and
providing the memory controller with the remapped second physical address for a retry of the memory transaction.

13. The method of claim 9, further comprising:
tracking a number of errors detected for the memory segment targeted by the first physical address over a period of time; and
deeming the memory segment targeted by the first physical address to have a reproducible fault in response to the number of errors exceeding a threshold.

14. One or more machine-readable storage media comprising stored thereon instructions, which in response to execution by a machine cause the machine to:
detect a reproducible fault at a first physical address targeting a first physical memory segment in one of a plurality of memory devices;
in response to the detection of the reproducible fault, remap the first physical address to a second physical address, the second physical address targeting a second physical memory segment in one of the plurality of memory devices;
store the first and second physical addresses in an entry in an address swap cache;
receive a memory transaction targeting the first physical address;
perform a lookup in parallel with a memory controller sending the memory transaction to the one of the plurality of memory devices containing the memory segment targeted by the first physical address, the lookup to identify the entry in the address swap cache storing the first physical address;

in response to the identification, flag the memory transaction invalid and swap the second physical address into the memory transaction for the first physical address, wherein the swap of the first and second physical addresses includes replacement of the first physical address in the memory transaction with the second physical address; and provide the memory controller with the second physical address for a retry of the memory transaction.

15. The one or more machine-readable storage media of claim 14, wherein the machine is further caused to:

after the remap, remove the memory segment targeted by the second physical address from a memory swap pool;

wherein the memory swap pool comprises a plurality of spare memory segments, the second physical address targeting a segment of memory in the memory swap pool prior to the removal of the memory segment targeted by the second physical address from the memory swap pool.

16. The one or more machine-readable storage media of claim 15, wherein the plurality of spare memory segments in the memory swap pool are outside of an operating system-visible memory address space.

17. The one or more machine-readable storage media of claim 14, wherein the machine is further caused to:

perform the lookup prior to a memory controller sending the memory transaction to the one of the plurality of memory devices containing the memory segment targeted by the first physical address; and provide the memory controller with the remapped second physical address to send the memory transaction in response to the lookup positively identifying the first physical address as present in the address swap cache.

18. The one or more machine-readable storage media of claim 14, wherein the machine is further caused to:

track a number of errors detected for the memory segment targeted by the first physical address over a period of time; and deem the memory segment targeted by the first physical address to have a reproducible fault in response to the number of errors exceeding a threshold.

19. A system, comprising:

a memory module comprising a plurality of memory devices;

a memory controller including an address swap cache; and a memory segment swap logic configured to:

detect a reproducible fault at a first physical address targeting a first physical memory segment in one of the plurality of memory devices;

in response to the detection of the reproducible fault, remap the first physical address to a second physical address, the second physical address targeting a second physical memory segment in one of the plurality of memory devices;

store the first and second physical addresses in an entry in the address swap cache;

receive a memory transaction targeting the first physical address;

perform a lookup in parallel with the memory controller sending the memory transaction to the one of the plurality of memory devices containing the memory segment targeted by the first physical address, the lookup to identify the entry in the address swap cache storing the first physical address;

in response to the identification, flag the memory transaction invalid and swap the second physical address into the memory transaction for the first physical address, wherein said swap of the first and second physical addresses includes replacement of the first physical address in the memory transaction with the second physical address; and provide the memory controller with the second physical address for a retry of the memory transaction.

20. The system of claim 19, wherein the memory segment swap logic is further configured to:

perform the lookup prior to the memory controller sending the memory transaction to the one of the plurality of memory devices containing the memory segment targeted by the first physical address; and provide the memory controller with the remapped second physical address to send the memory transaction in response to the lookup positively identifying the first physical address as present in the address swap cache.

* * * * *